United States Patent
Rangarajan et al.

(10) Patent No.: US 6,562,723 B1
(45) Date of Patent: May 13, 2003

(54) HYBRID STACK METHOD FOR PATTERNING SOURCE/DRAIN AREAS

(75) Inventors: Bharath Rangarajan, Santa Clara, CA (US); Jeffrey A. Shields, Sunnyvale, CA (US); Ursula Q. Quinto, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/430,160

(22) Filed: Oct. 29, 1999

(51) Int. Cl.[7] .................... H01L 21/302; H01L 21/461
(52) U.S. Cl. .................. 438/734; 438/297; 438/439
(58) Field of Search ................................ 438/225, 297, 438/362, 439, 734, 791, 952

(56) References Cited

U.S. PATENT DOCUMENTS

| | | | | |
|---|---|---|---|---|
| 5,397,733 A | * | 3/1995 | Jang ........................... | 257/509 |
| RE35,294 E | * | 7/1996 | Vasquez et al. ............. | 438/439 |
| 5,968,842 A | * | 10/1999 | Hsiao ......................... | 438/633 |
| 6,066,545 A | * | 5/2000 | Doshi et al. ................. | 438/225 |

* cited by examiner

Primary Examiner—Amir Zarabian
Assistant Examiner—Jamie L. Brophy
(74) Attorney, Agent, or Firm—Foley & Lardner (57) ABSTRACT

A method of manufacturing an integrated circuit which reduces damage to the underlying base layer and the created oxide structures is disclosed herein. The method includes providing a hybrid stack disposed over an underlying layer, providing an IC structure pattern over the hybrid stack, selectively removing the top layer and a portion of the bottom layer according to the IC structure pattern, leaving a protective portion of the bottom layer according to the IC structure pattern, removing the protective portion of the bottom layer, building oxide structures in the underlying layer according to the IC structure pattern, and removing remaining portions of the hybrid stack. An integrated circuit is also disclosed which is prepared by a process including: providing a hybrid stack disposed over an underlying layer, providing an IC structure pattern over the hybrid stack, selectively removing a portion of the hybrid stack according to the IC structure pattern, leaving a protective portion of the bottom layer according to the IC structure pattern, building oxide structures on the underlying layer, and removing remaining portions of the hybrid stack.

20 Claims, 5 Drawing Sheets

HYBRID STACK METHOD FOR PATTERNING SOURCE/DRAIN AREAS

CROSS REFERENCE TO RELATED APPLICATIONS

This patent application is related to U.S. application Ser. No. 09/373,084, now U.S. Pat. No. 6,265,294 issued on Jul. 24, 2001, by Parks et al., entitled "Integrated Circuit Having Double Barrier Anti-Reflective Coating Layer"; and U.S. application Ser. No. 09/430,157 by Rangarajan, entitled "Shallow Trench Isolation Process Using a Deposited Nitride Layer", both of which are filed on an even date herewith and assigned to the assignee of the present invention.

FIELD OF THE INVENTION

The present invention is related to integrated circuit (IC) devices and processes of making IC devices. More particularly, the present invention relates to a method for using a hybrid stack to increase source/drain patterning precision.

BACKGROUND OF THE INVENTION

Integrated circuits (ICs) include a multitude of transistors formed on a semiconductor substrate. Various methods of forming transistors on a semiconductor substrate are known in the art. For example, one method of forming transistors on a silicon substrate involves the well known Local Oxidation of Silicon (LOCOS) process.

A conventional LOCOS process typically includes the following simplified steps. First, a silicon nitride layer is provided on the silicon substrate. Next, using a lithography and etch process, the nitride layer is selectively removed to produce a pattern where transistor source/drain areas are to be located. After patterning the source/drain areas, a field oxide is grown. As oxide growth is inhibited where the nitride layer still remains, the oxide only grows on the silicon substrate exposed during the source/drain patterning step. Finally, after oxide growth is complete, the remaining portions of the nitride layer are removed leaving only the oxidized source/drain areas on the exposed silicon substrate.

Imprecise control of the transistor forming process limits an IC manufacturer's ability to increase transistor density. A significant source of imprecision is derived from the lithography and etch process. Thus, to increase transistor density, IC manufacturer's are forced to purchase advanced equipment or to develop lithography and etch processes that allow increased precision from existing equipment. It is desirable to use either existing 365 nm or 248 nm lithography to achieve high density transistors using the LOCOS process.

To increase precision from existing lithography equipment, understanding the lithography and etch process and its limitations is essential. Generally, the process steps include: (1) placing a layer of photoresist over an existing nitride layer, (2) exposing the photoresist to radiation through a mask containing the transistor source/drain pattern, (3) developing the photoresist to define the source/drain pattern on the nitride layer, (4) etching away and removing the nitride layer defined by the developed photoresist, and (5) stripping off the remaining photoresist to leave a patterned nitride layer.

Figure 1A:
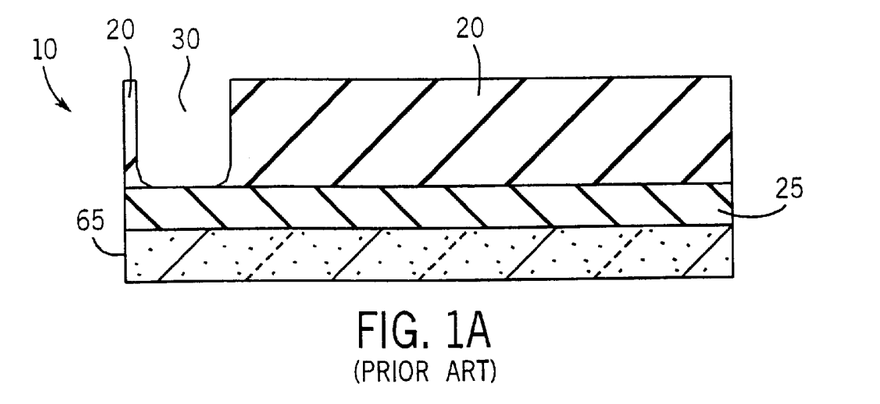
FIGS. 1A–D are cross-sectional views of a portion of an integrated circuit illustrating problems resulting from nitride layer reflectivity.
Figure 1B:
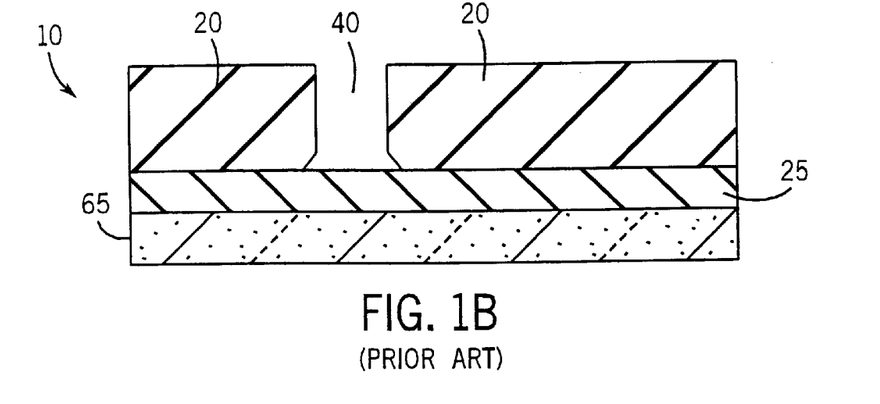
Figure 1C:
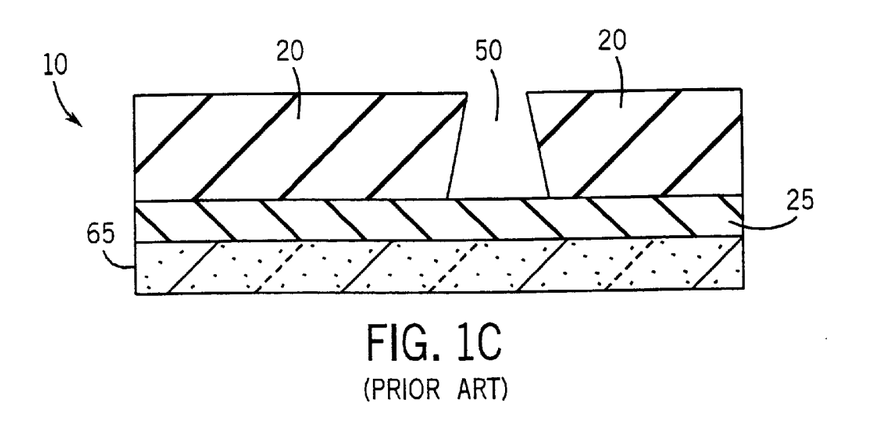
Figure 1D:
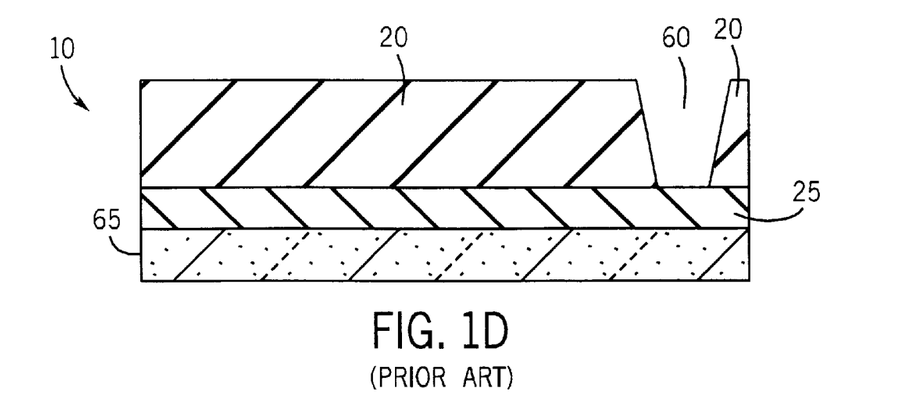

During the radiation exposure step, areas adjacent to the source/drain pattern can be unintentionally exposed to reflected radiation. Exposure to reflected radiation is increased if the thickness of the nitride layer is not accurately controlled. This uncontrolled exposure to reflected radiation limits source/drain pattern precision and, ultimately, transistor density. FIGS. 1A–D, cross-sectional views of pattern imprecision resulting from nitride layer reflectivity, show a portion 10 of an integrated circuit including a photoresist layer 20, a silicon nitride layer 25 and an underlying layer 65. The portion 10 illustrates four undesirable characteristics of apertures in the photoresist layer 20: (1) a footed aperture 30 (FIG. 1A), (2) an undercut aperture 40 (FIG. 1B), (3) a re-entrant aperture 50 (FIG. 1C), and (4) a tapered aperture 60 (FIG. 1D). The undesirable aperture characteristics shown in the portion 10 are the result of radiation reflected during the radiation exposure step. The unpredictable occurrence of the aperture characteristics limits transistor density. The undesirable aperture characteristics generally do not occur simultaneously and are shown in FIGS. 1A–D as examples of types of problems which may occur.

Various methods for reducing or compensating for reflected radiation have been developed. For example, it is known in the art that careful control of nitride layer thickness reduces reflected radiation variance. With the radiation variance reduced, compensation for reflected radiation is more easily attained. However, controlling nitride layer thickness requires the nitride layer to be grown or deposited very slowly. This slow process rate reduces production throughput and increases costs.

Other methods for reducing nitride layer reflectivity involve application of an anti-reflective coating (ARC) between the nitride layer and the photoresist. The ARC material is selected for its ability to absorb radiation during the exposure step. Thus, by applying the ARC, radiation which would ordinarily be reflected by the nitride layer is absorbed by the ARC. In general, two types of ARCs are used: (1) organic ARCs and (2) inorganic ARCs. While use of either type of ARC significantly reduces problems related to reflectivity, both types have drawbacks. For example, organic ARCs are typically very dirty, difficult to apply uniformly, and difficult to remove. These drawbacks result in high defect densities, and consequently reduced yields.

Inorganic ARCs, such as silicon oxynitride (SiON), are generally preferable to organic ARCs because use of inorganic ARCs results in considerably lower defect densities. While use of inorganic ARCs yields lower defect densities, inorganic ARCs can oxidize often during the LOCOS oxidation step. ARC layer oxidation is detrimental as the process of removing an oxidized ARC layer also removes oxidized source/drain areas. Thus, to avoid removing oxidized source/drain areas, the inorganic ARC layer must be removed prior to the oxidation step. However, removing the inorganic ARC before oxidation causes pitting on the surface of the exposed semiconductor substrate which results in defects.

Thus, there is a need for a high throughput IC processing method which reduces reflectivity related problems while minimizing introduction of additional defects.

SUMMARY OF THE INVENTION

One embodiment of the invention relates to a method of manufacturing an integrated circuit (IC). The method includes providing a hybrid stack, providing an IC structure pattern over the hybrid stack, and selectively removing a portion of the hybrid stack according to the IC structure pattern. The hybrid stack includes a top layer and a bottom layer and is disposed over an underlying layer. The selectively removing step is performed such that a protective portion of the bottom layer remains over the underlying layer. The protective portion acts to minimize damage to the underlying layer during the selectively removing step. After the selectively removing step, the method continues by removing the protective portion, building oxide structures on the underlying layer, and removing remaining portions of the hybrid stack.

Another embodiment also relates to a method of manufacturing an integrated circuit (IC). The method includes providing a hybrid stack, providing an IC structure pattern over the hybrid stack, selectively removing a portion of the hybrid stack to expose the underlying layer according to the IC structure pattern, building oxide structures on the exposed underlying layer, and removing remaining portions of the hybrid stack. The hybrid stack includes a top layer of silicon nitride and a bottom layer of silicon oxynitride and is disposed over an underlying layer.

Another embodiment of the invention relates to an integrated circuit prepared by a LOCOS process by providing a hybrid stack, providing an IC structure pattern over the hybrid stack, and selectively removing a portion of the hybrid stack according to the IC structure pattern. The hybrid stack includes a top layer and a bottom layer and is disposed over an underlying layer. The selectively removing step is performed such that a protective portion of the bottom layer remains over the underlying layer. The protective portion acts to minimize damage to the underlying layer during the selectively removing step. After the selectively removing step, the method continues by removing the protective portion, building oxide structures on the underlying layer, and removing remaining portions of the hybrid stack.

Yet another embodiment of the invention relates to an integrated circuit manufactured using LOCOS by providing a hybrid stack, providing an IC structure pattern over the hybrid stack, selectively removing a portion of the hybrid stack to expose the underlying layer according to the IC structure pattern, building oxide structures on the exposed underlying layer, and removing remaining portions of the hybrid stack. The hybrid stack includes a top layer of silicon nitride and a bottom layer of silicon oxynitride and is disposed over an underlying layer. The removing remaining portions step minimizes damage to the oxide structures during removal of the remaining portions of the hybrid stack.

BRIEF DESCRIPTION OF THE DRAWINGS

The present invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 2:
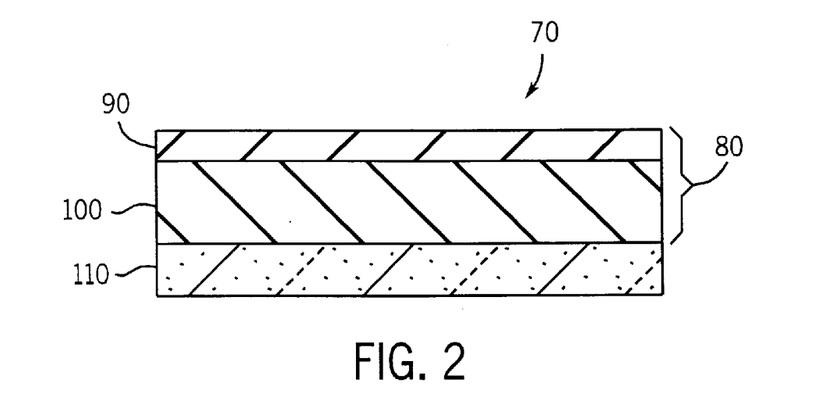
FIG. 2 is a cross-sectional view of a portion of an integrated circuit (IC) in accordance with an exemplary embodiment of the present invention.

FIGS. 2 through 6 illustrate a method of manufacturing an integrated circuit (IC) in accordance with an exemplary embodiment of the present invention. Referring to FIG. 2, a cross-sectional view of a portion 70 of an IC is illustrated. Portion 70 includes a hybrid stack 80, including a top layer 90 and a bottom layer 100, disposed over an underlying layer 110. It should be noted that although FIG. 2 illustrates the hybrid stack 80 as a composition of two layers, the top layer 90 and the bottom layer 100, three or more layers may be used without departing from the scope of the invention.

In the exemplary embodiment of the present invention, the underlying layer 110 is a silicon substrate with a thin overlying layer of silicon dioxide (e.g. a pad oxide layer). It should be noted that the underlying layer 110 may be comprised of one or more layers of compositions, such as epitaxial layers, known in the art without departing from the scope of the present invention.

The top layer 90 is made of a material known to absorb radiation at selected wavelengths. In the exemplary embodiment, the top layer 90 is composed of silicon oxynitride (SiON), however, other materials known to absorb radiation may also be used. The top layer 90 must be thick enough to absorb radiation and thin enough to be easily removed. In the exemplary embodiment, the top layer 90 is about 300 Angstroms thick and is an anti-reflective coating.

The bottom layer 100 is made of a material capable of both protecting the underlying layer 110 during IC manufacture and resistant to oxidation. Thickness of the bottom layer 100 is chosen, based on the selected material, to minimize radiation reflection. In the exemplary embodiment, the bottom layer 100 is a silicon nitride ($Si_3N_4$) layer about 1700 Angstroms thick. It should be noted that materials other than $Si_3N_4$ may also be used, and thickness other than 1700 Å can be used.

Figure 3:
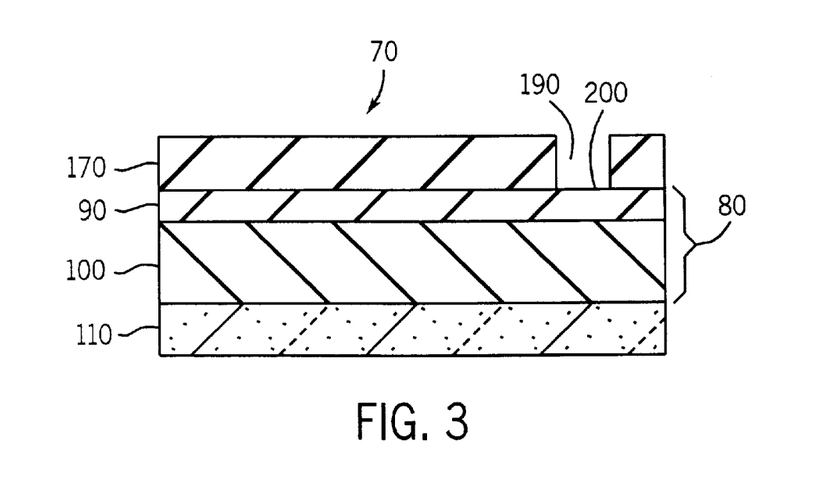
FIG. 3 is a cross-sectional view of an IC structure pattern over the IC portion illustrated in FIG. 2.

Referring to FIG. 3, a patterned photoresist layer 170 is formed over the top layer 90 by any photolithography process known in the art. The patterned photoresist layer 170 is formed such that the top layer 90 is exposed at surface 200 through an IC structure pattern 190. With the top layer 90 exposed at the surface 200, an etch process is performed to selectively remove portions of the hybrid stack 80 corresponding to the exposed surface 200.

Figure 4:
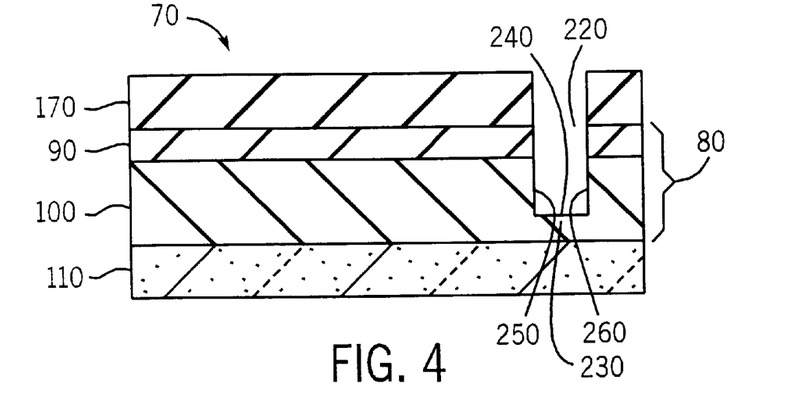
FIG. 4 is a cross-sectional view after selective removal of regions of the IC portion illustrated in FIG. 2.

Referring to FIG. 4, by selectively removing portions of the hybrid stack 80, an aperture 220 is opened. The aperture 220, opened according to the IC structure pattern 190 of FIG. 3, extends through the top layer 90 and substantially through the bottom layer 100. The etch process performed to open the aperture 220 is continued until only a protective portion 230 of the bottom layer 100 remains above the underlying layer 110. The protective portion 230 must be thick enough to protect the underlying layer 110 during the succeeding processing steps and thin enough to allow removal of the protective portion 230 without also removing excessive portions of the residual bottom layer 100 at left surface 250, and right surface 260. In the exemplary embodiment, the protective portion 230 is between 100 and 200 Angstroms thick. However, it should be noted that a protective portion 230 with a thickness outside of the 100 to 200 Angstrom range can be used depending upon process parameters and material characteristics.

With the aperture 220 opened and the protective portion 230 remaining, the photoresist 170 is stripped off leaving the top layer 90 exposed. The photoresist may be stripped using any stripping process known in the art. Following photoresist removal, the remaining portion of the top layer 90 is removed. While any process for removing the top layer 90 may be used, it is preferable to remove the top layer 90 by a process that minimizes removal of the bottom layer 100 at the left surface 250, the right surface 260, and a protective surface 240 of the protective layer 230.

In the exemplary embodiment of the present invention, a buffered oxide etch solution is used to remove the top layer 90. The buffered oxide etch solution is known to remove SiON at a rate of 15 to 30 Angstroms per minute and $Si_3N_4$ at a rate of about 2.5 Angstroms per minute. Therefore, using the buffered oxide etch solution, the top layer 90, composed of 300 Angstroms of SiON, is removed in 10 to 20 minutes (at a rate of 15–30 Å/min) while only 25 to 50 Angstroms of the $Si_3N_4$ bottom layer 100 is removed at the left surface 250, the right surface 260, and the protective surface 240. Layer 90 can be removed using the identical etch process used to selectively remove portions of layer 90 discussed above. During removal of the top layer 90, the underlying layer 110 is protected from damage by the protective portion 230.

Figure 5:
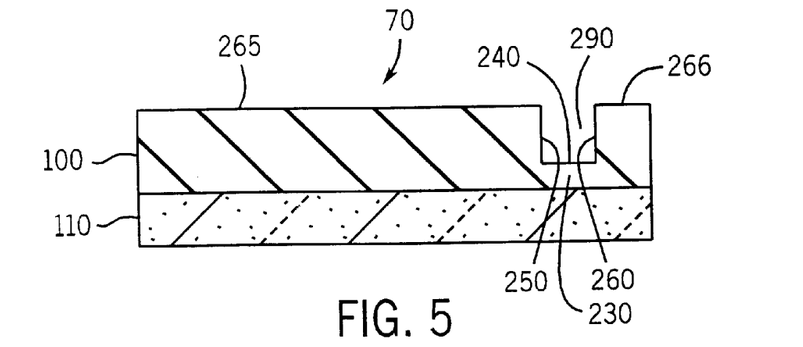
FIG. 5 is a cross-sectional view after top layer removal from the IC portion illustrated in FIG. 2.

FIG. 5 illustrates a cross-sectional view of the IC portion 70 after removal of the top layer 90. As the top layer 90 is composed of a material susceptible to oxidation, removal of the top layer 90 with the protective portion 230 in place above the underlying layer 110, advantageously eliminates an oxidation potential of the hybrid stack 80 without damaging the underlying layer 110.

Having removed the top layer 90, the protective portion 230 is removed to expose the underlying layer 110. Referring to FIG. 5, a blanket etch, such as a blanket nitride etch, is performed to remove the protective portion 230. In addition to removing the protective portion 230, an amount corresponding to the thickness of the protective portion 230 is removed by the blanket etch from a top left surface 265, a top right surface 266, the left surface 250, and the right surface 260 of the bottom layer 100. After removing the protective portion 230, the underlying layer 110 is exposed through an aperture 310 shown in FIG. 6. The bottom layer 100 still remains in areas where the underlying layer 110 must be shielded during subsequent LOCOS processing steps.

Figure 6:
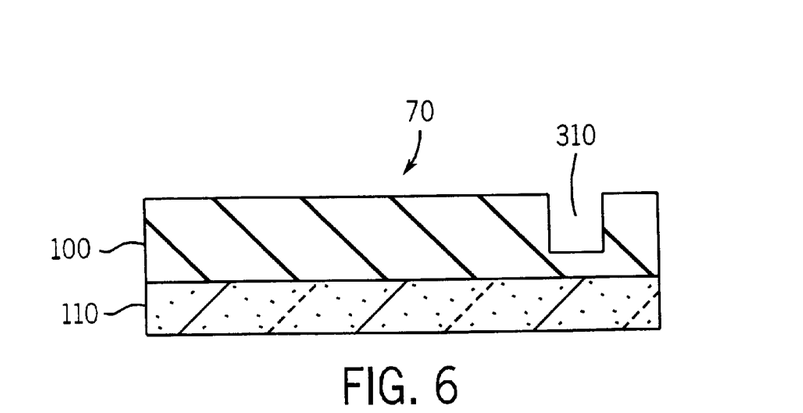
FIG. 6 is a cross-sectional view after bottom layer removal from the IC portion illustrated in FIG. 2.

With the underlying layer 110 exposed through the aperture 310, the finishing steps of the LOCOS process can be completed. First, the portion 70 is cleaned. Next, an oxide is grown over both the residual bottom layer 100 and the exposed underlying layer 110. As oxide growth is inhibited where the bottom layer 100 still remains over the underlying layer 110, the oxide primarily grows on the exposed underlying layer 110. Finally, after the oxide growth is complete, residual portions of the bottom layer 100 are removed leaving only the selectively oxidized underlying layer 110 (e.g. only an oxidized structure at the location of the aperture 310).

Figure 7:
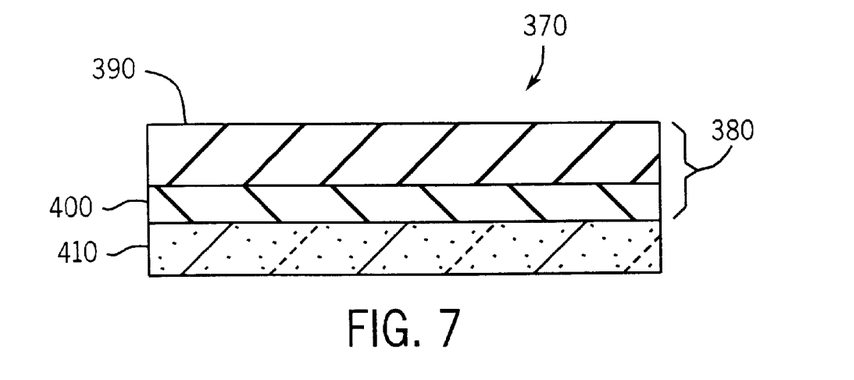
FIG. 7 is a cross-sectional view of a portion of an IC in accordance with an alternative embodiment of the present invention.

FIGS. 7 through 12 illustrate an alternative embodiment. Referring to FIG. 7, a cross-sectional view of a portion 370 of an IC is illustrated. Portion 370 includes a hybrid stack 380, including a top layer 390 and a bottom layer 400, disposed over an underlying layer 410. Similar to the exemplary embodiment in FIGS. 1 through 6, it should be noted that the hybrid stack 380 may consist of two or more layers without departing from the scope of the invention.

In the alternative embodiment, the underlying layer 410 is a silicon substrate with a thin overlying layer of silicon dioxide. It should be noted that the underlying layer 410 may be comprised of one or more layers of compositions known in the art without departing from the scope of the present invention.

The top layer 390 is made of a material capable of both protecting the underlying layer 410 during IC manufacture and resistant to oxidation. Thickness of the top layer 390 is chosen, based on the selected material, to minimize radiation reflection. In the exemplary embodiment, the top layer 390 is a silicon nitride ($Si_3N_4$) layer about 1700 Angstroms thick (e.g., a range of 800 Å to 2000 Å or more). It should be noted that materials other than $Si_3N_4$ may also be used without departing from the scope of present invention.

The bottom layer 400 is made of a material known to absorb radiation at selected wavelengths. The bottom layer 400 is preferably composed of SiON, however, other materials known to absorb radiation can also be used. The bottom layer 400 must be thick enough to absorb radiation. In the alternative embodiment, the bottom layer 400 is about 300 Angstroms thick (e.g., a range of 100–1100 Å)

Figure 8:
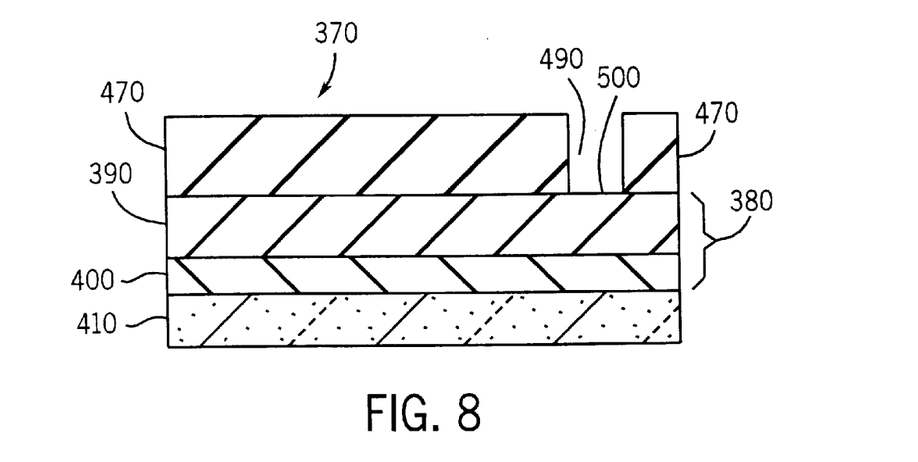
FIG. 8 is a cross-sectional view of an IC structure pattern over the IC portion illustrated in FIG. 7.

Referring to FIG. 8, a patterned photoresist layer 470 is formed on the top layer 390 by any photolithography process known in the art. The patterned photoresist layer 470 is formed such that the top layer 390 is exposed at surface 500 through an IC structure pattern 490. With the top layer 390 exposed at the surface 500, an etch process is performed to selectively remove portions of the hybrid stack 380 corresponding to the exposed surface 500.

Figure 9:
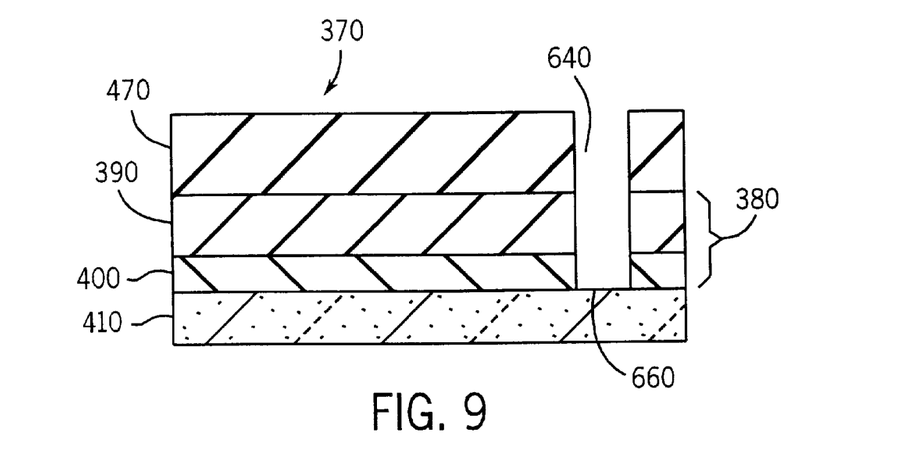
FIG. 9 is a cross-sectional view illustrating exposure of an underlying layer after selective removal of regions of the IC portion illustrated in FIG. 7.
Figure 10:
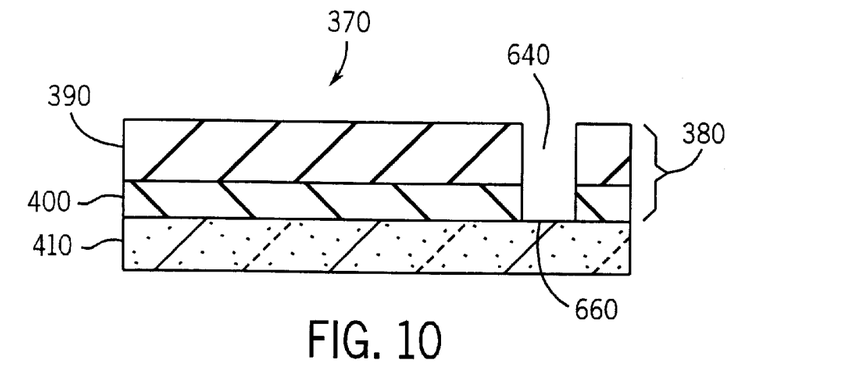
FIG. 10 is a cross-sectional view after photoresist removal from the IC portion illustrated in FIG. 9.

Referring to FIG. 9, as portions of the hybrid stack 380 are selectively removed, an aperture 640 is opened. The aperture 640, opened according to the IC structure pattern 490 of FIG. 8, extends through both the top layer 390 and the bottom layer 400 of the hybrid stack 380 exposing the underlying layer 410 at a surface 660. With the aperture 640 opened, the photoresist 470 is stripped off leaving the top layer 390 exposed as shown in FIG. 10. The photoresist 470 can be stripped by any stripping process known in the art.

Figure 11:
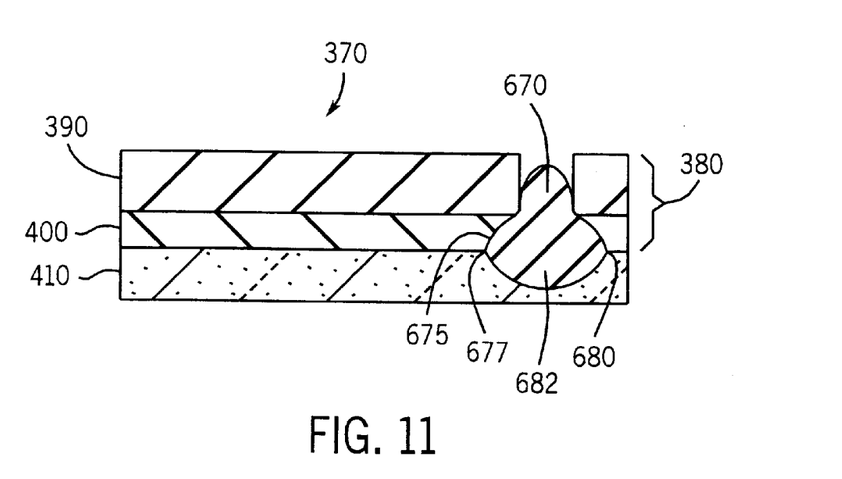
FIG. 11 is a cross-sectional view of oxidation over the IC portion illustrated in FIG. 7.

Referring now to FIG. 11, an oxide 670 is grown by steam oxidation within the aperture 640 shown in FIG. 10. Oxidation causes the underlying layer 410 to oxidize at the surface 660, and the bottom layer 400 to oxidize at left surface 675 and right surface 680. Oxide 670 extends vertically in aperture 640 to a point of one-half of the thickness of layer 390. In addition, oxidation occurs where the interface between the bottom layer 400 and the underlying layer 410 is exposed at left junction 676 and right junction 681. This oxidation at the interface of the bottom layer 400 and the underlying layer 410 forms a left structure 677 and a right structure 682. The left structure 677 and the right structure 682 are commonly known in the art as "bird's beaks." Referring again to FIG. 11, while the bottom layer 400 oxidizes at the left surface 675 and the right surface 680, further oxidation of the bottom layer 400 is prevented by the top layer 390 which is resistant to oxidation.

Figure 12:
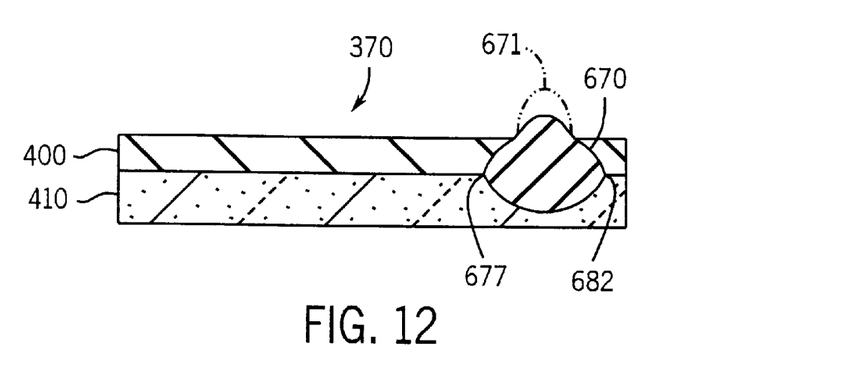
FIG. 12 is a cross-sectional view of an oxide structure on a remaining underlying layer.

In FIG. 12, residual portions of the hybrid stack 380 are removed leaving only the oxide structure 670 on the underlying layer 410. The oxide structure 670 may be damaged by processes designed to remove oxidized portions of the hybrid stack 380. A dotted line 671 shows the original size of portion 670. Since layer 400 is protected from oxidation by covering the layer 400 with the oxidation resistant top layer 390, layers 390 and 400 can be simultaneously removed in a nitride strip process. The nitride strip process (e.g., less than 0.04 Å per minute) does not significantly damage oxide structure 670.

The method illustrated in FIGS. 2 through 12 reduces reflectivity related problems by combining a radiation absorbing layer with a layer capable of protecting the underlying layer. Advantageously, the reduction in reflectivity related problems is accomplished without increased damage to the underlying layer or oxide structures.

It is understood that while the detailed drawings, specific examples, and particular values given provide a preferred exemplary embodiment of the present invention, it is for the purpose of illustration only. The method and apparatus of the invention is not limited to the precise details and conditions disclosed. Various changes may be made to the details disclosed without departing from the spirit of the invention which is defined by the following claims.

What is claimed is:

1. A method of manufacturing an integrated circuit (IC) comprising:
    providing a hybrid stack including a top layer and a bottom layer, said hybrid stack disposed over an underlying layer;
    providing an IC structure pattern over said hybrid stack;
    selectively removing said top layer and a portion of said bottom layer according to said IC structure pattern, thereby leaving a protective portion of said bottom layer according to said IC structure pattern;
    removing said protective portion of said bottom layer;
    building oxide structures in said underlying layer according to said IC structure pattern; and
    removing remaining portions of said hybrid stack, wherein said selectively removing step comprises:
        using a first process to remove said top layer and portions of said bottom layer according to said IC structure pattern whereby an aperture which proceeds through said top layer and substantially through said bottom layer is created according to said IC structure pattern; and
        using a second process to remove remaining portions of said top layer, wherein said first process and said second process are identical.

2. The method of claim 1, wherein said top layer reflects less radiant energy than said bottom layer at a selected wavelength.

3. The method of claim 1, wherein said top layer is a layer of silicon oxynitride and said bottom layer is a silicon nitride layer.

4. The method of claim 1, wherein said selectively removing step uses a buffered oxide etch solution.

5. The method of claim 1, wherein said removing said protective portion step is done by a third process.

6. The method of claim 4, wherein said second process includes a buffered oxide etch solution.

7. The method of claim 5, wherein said third process includes a blanket nitride etch.

8. The method of claim 1, wherein said protective portion is less than 300 Angstroms thick over said underlying layer.

9. The method of claim 4, wherein said first process and said second process etch the top layer at a rate of 15 to 30 Å per minute.

10. A method of manufacturing an integrated circuit (IC) comprising:
    providing a hybrid stack including a top layer of silicon oxynitride and a bottom layer of silicon nitride, said hybrid stack disposed over an underlying layer;
    providing an IC structure pattern over said hybrid stack;
    selectively removing said top layer and a portion of said bottom layer of said hybrid stack according to said IC structure pattern, thereby leaving a protective portion of said bottom layer according to said IC structure pattern in a first process;
    removing the IC structure pattern over said hybrid stack;
    removing remaining portions of said top layer using the first process;
    removing said protective portion of said bottom layer to form an aperture, the aperture exposing said underlying layer according to said IC structure pattern; and
    building oxide structures in said underlying layer at said aperture;
    removing remaining portions of said bottom layer of said hybrid stack.

11. The method of claim 10, wherein said second removing remaining portions step minimizes damage to said oxide structures.

12. The method of claim 10, wherein said first removing remaining portions step includes an oxide etch and said second removing remaining portions step includes a nitride etch.

13. The method of claim 10, wherein said first removing remaining portions step comprises removing remaining portions of said top layer with the first process and said removing said protective portion of said bottom layer step comprises removing said protective portion with a second process.

14. An IC prepared by a LOCOS process comprising the steps:
    providing a hybrid stack including a top layer and a bottom layer, said hybrid stack disposed over an underlying layer;
    providing an IC structure pattern over said hybrid stack;
    selectively removing said top layer and a portion of said bottom layer according to said IC structure pattern, thereby leaving a protective portion of said bottom layer according to said IC structure pattern;
    removing said protective portion of said bottom layer;
    building oxide structures in said underlying layer according to said IC structure pattern; and
    removing remaining portions of said hybrid stack, wherein said selectively removing step comprises:
        using a first process to remove said top layer and portions of said bottom layer according to said IC structure pattern whereby an aperture which proceeds through said top layer and substantially through said bottom layer is created according to said IC structure pattern; and
        using a second process to remove remaining portions of said top layer, wherein the first process and the second process are the same etch process.

15. The IC of claim 14, wherein said top layer reflects less radiant energy than said bottom layer at a selected wavelength.

16. The IC of claim 14, wherein said top layer is a layer of silicon oxynitride and said bottom layer is a silicon nitride layer.

17. The IC of claim 14, wherein said selectively removing step uses an etch, the etch being detrimental to the oxide structures.

18. The IC of claim 17, wherein said second process includes a buffered oxide etch solution.

19. The IC of claim 14, wherein said removing said protective portion step includes a blanket nitride etch.

20. An IC prepared by a LOCOS process comprising the steps:

providing a hybrid stack including a top layer of silicon oxynitride and a bottom layer of silicon nitride, said hybrid stack disposed over an underlying layer;

providing an IC structure pattern over said hybrid stack;

selectively removing said top layer and a portion of said bottom layer of said hybrid stack according to said IC structure pattern, thereby leaving a protective portion of said bottom layer, in a first etch process and removing a remaining portion of the top layer in the first etch process;

removing said protective portion of the bottom layer to expose the underlying layer;

building oxide structures in said underlying layer according to said IC structure pattern; and removing remaining portions of said bottom layer of the hybrid stack.

\* \* \* \* \*